(12) United States Patent
Baskaran et al.

(10) Patent No.: US 10,145,871 B2
(45) Date of Patent: Dec. 4, 2018

(54) SYSTEMS AND METHODS FOR JOINT ANGLE-FREQUENCY DETERMINATION

(71) Applicant: Reservoir Labs, Inc., New York, NY (US)

(72) Inventors: Muthu M. Baskaran, Bayonne, NJ (US); Thomas Henretty, Brooklyn, NY (US); Ann Johnson, Saratoga, CA (US); M. H. Langston, New Windsor, NY (US); Richard A. Lethin, New York, NY (US); Janice O. McMahon, Bethesda, MD (US); Benoit J. Meister, New York, NY (US); Paul Mountcastle, Moorestown, NJ (US)

(73) Assignee: SIGNIFICS AND ELEMENTS, LLC, New York, NY (US)

( * ) Notice: Subject to any disclaimer, the term of this patent is extended or adjusted under 35 U.S.C. 154(b) by 349 days.

(21) Appl. No.: 14/699,871

(22) Filed: Apr. 29, 2015

(65) Prior Publication Data

US 2015/0309097 A1 Oct. 29, 2015

Related U.S. Application Data

(60) Provisional application No. 61/985,782, filed on Apr. 29, 2014.

(51) Int. Cl.
*G01R 23/02* (2006.01)
*G01R 25/00* (2006.01)
*G01S 3/74* (2006.01)
*G01S 7/02* (2006.01)

(52) U.S. Cl.
CPC ............ *G01R 23/02* (2013.01); *G01R 25/00* (2013.01); *G01S 3/74* (2013.01); *G01S 7/021* (2013.01)

(58) Field of Classification Search
CPC combination set(s) only.
See application file for complete search history.

(56) References Cited

U.S. PATENT DOCUMENTS

| 2014/0044043 A1* | 2/2014 | Moshfeghi | ............ H04W 84/00 370/328 |
|---|---|---|---|
| 2014/0327567 A1* | 11/2014 | Kishigami | .............. G01S 13/91 342/146 |

(Continued)

OTHER PUBLICATIONS

E.J. Candes and M.B. Wakin, "An Introduction to Compressive Sampling," in *IEEE Signal Processing Magazine*, vol. 25, No. 2, pp. 21-30, Mar. 2008.

(Continued)

*Primary Examiner* — Mamadou Diallo
(74) *Attorney, Agent, or Firm* — Goodwin Procter LLP

(57) ABSTRACT

A system for data acquisition and processing includes a selector for obtaining samples from one or more sensors, each of which is configured to collect a sample during one or more sampling intervals forming a dwell period. The selector is configured to obtain only a subset of samples of a complete set of samples that can be collected during a dwell period. A solver is configured to solve an underdetermined system based on the collected samples and a mapping relation/phase function, to jointly determine one or more angles and one or more frequencies of transmissions received by the one or more sensors.

28 Claims, 7 Drawing Sheets

(56) References Cited

U.S. PATENT DOCUMENTS

| | | | | |
|---|---|---|---|---|
| 2014/0343878 | A1* | 11/2014 | Gudmundsson ... | G01R 19/2513 702/64 |
| 2015/0057876 | A1* | 2/2015 | Graham ............ | B60C 23/0416 701/33.4 |
| 2015/0287422 | A1* | 10/2015 | Short ................. | G01S 7/288 704/205 |
| 2017/0013632 | A1* | 1/2017 | Bercovich ........... | H04L 5/00 |
| 2017/0016988 | A1* | 1/2017 | Numata .............. | G01S 7/032 |
| 2017/0055131 | A1* | 2/2017 | Kong .................. | H04W 4/027 |
| 2017/0156069 | A1* | 6/2017 | Moshfeghi .......... | H04W 24/02 |

OTHER PUBLICATIONS

Davenport, M., Duarte, M., Eldar, Y., & Kutyniok, G. (2012). Introduction to compressed sensing. In Y. Eldar & G. Kutyniok (Eds.), *Compressed Sensing: Theory and Applications*(pp. 1-64). Cambridge: Cambridge University Press.

Anderson, E. et al. "The Mosek Interior Point Optimizer for Linear Programming: An Implementation of the Homogeneous Algorithm", Applied Optimization, vol. 33., Springer, Boston, MA, 2000. (33 pages).

Candes, E. et al. "Decoding by Linear Programming", IEEE Transactions on Information Theory, vol. 51, No. 12, Dec. 2005. (13 pages).

Dirac, P.A.M. "The Principles of Quanum Mechanics", Oxford University Press, 1958. (324 pages).

Domahidi, A. et al., "ECOS: An SOCP Solver for Embedded Systems: 2013 European Control Conference (ECC):", Jul. 17-19, 2013, Zurich, Switzerland. (6 pages).

Grant, M. "The CVX Users' Guide, Release 2.1", CVX Research, Dec. 26, 2017. (99 pages).

Gurobi Organization, "Gurobi Optimizer Reference Manual", 2018. (773 pages).

Kay, Steven M. "Spectrum Analysis—A Modern Perspective", Proceedings of the IEEE, vol. 69, No. 11, Nov. 1981. (41 pages).

Lofberg, Johan. "YALMIP: A toolbox for modeling and optimization in MATLAB", Conference Paper, Automatic Control Laboratory, ETHZ, Dec. 17, 2016. (7 pages).

Malioutov, Dmitry et al. "A Sparse Signal Reconstruction Perspective for Source Localization With Sensor Arrays," IEEE Transactions on Signal Processing, vol. 53, No. 8, Aug. 2005. (13 pages).

Miller, B. B et al."A Multi-Sensor Compressed Sensing Receiver: Performance Bounds and Simulated Results", Asilomar 2009. (5 pages).

Mountcastle, P.D., et al. "Generalized Adaptive Radar Signal Processing", Technology Service Corporation, Dec. 1, 2008. (8 pages).

Schmidt, R. "Multiple Emitter Location and Signal Parameter Estimation," IEEE Transactions on Antenna and Propagation, vol. AP-34, No. 3, Mar. 1986. (5 pages).

Shankar, R. "Principles of Quantum Mechanics," 2nd ed., Kluwer Academic/Plenum Publishers, New York, 1980. (453 pages).

Sturm, Jos F., "Using SeDuMi 1.02, a MATLAB toolbox for optimization over symmetric cones", Communications Research Laboratory, McMaster University, Hamilton, Canada, Aug. 1, 1998. (24 pages).

Toh, K.C. "SDPT3—A Matlab Software Package for semidefinite programming, Version 1.3", Optimization Meth. & Soft., 1999, vol. 11 & 12, pp. 545-581. (38 pages).

Winter, S., et al., "On Real and Complex Valued L1-Norm Minimization for Overcomplete Bling Source Separation", NTT Communication Science Laboratories, IEEE, 2005. (4 pages).

* cited by examiner

Table 1: Rollup for GFLOPS/s and processor power requirements for baseline prototype ELINT computation

| Prototype | GFLOPS/s | Power [W] | Derated Power [W] |
|---|---|---|---|
| UHF/L-Band | 606 | 12 | 48 |
| S-Band | 2120 | 42 | 168 |
| C-Band | 908 | 18 | 72 |
| X-Band | 19,472 | 389 | 1,556 |
| Ku-Band | 17,702 | 354 | 1,416 |
| All Common Bands (above) | 63,820 | 1,276 | 5,104 |
| W-Band | 81,090 | 1,613 | 6,452 |
| All Bands (through 100 GHz) | 144,910 | 2,889 | 11,556 |

Table 2: Net power savings X-band and W-band (Sensor plus Processor)

| Prototype | Sensor (W) | Processor (W) | Total (W) | Improvement |
|---|---|---|---|---|
| X-Band Baseline | 1,556 | 1,556 | 3,112 | 1 x |
| W-Band Baseline | 6,452 | 6,452 | 12,904 | 1 x |
| X-Band | 97 | 259 | 357 | 8.7 x |
| W-Band | 403 | 2,304 | 2,708 | 4.7 x | ns and Methods for Joint Angle-Frequency Determination

SYSTEMS AND METHODS FOR JOINT ANGLE-FREQUENCY DETERMINATION

CROSS-REFERENCE TO RELATED APPLICATIONS

This application claims priority to and benefit of U.S. Provisional Patent Application No. 61,985/782, entitled "Compressive Sensing," that was filed on Apr. 29, 2014, the entire contents of which are incorporated herein by reference.

FIELD OF THE INVENTION

This disclosure generally relates to signal processing techniques and, in particular, to low power/energy processing of electro-magnetic signals.

BACKGROUND

Achieving significant (e.g., 5%, 10%, 25%, 30% or more) savings in the power needed to perform various signal processing tasks including, e.g., critical surveillance related functions, is an important goal. Savings in processor power may be achieved through innovative power-efficient microprocessor technology, and also by achieving improved utilization of the new power-efficient multicore signal processing environments that can perform embedded real-time signal-processing. Many applications, such as Electronic Intelligence (ELINT), processing of radar signals, processing of cellular communication signals, etc., are data intensive requiring acquisition and processing of hundreds of megabytes, a few gigabytes, or even more amounts of data in time periods as small as a few or tens of microseconds. Increasing computing power and/or using faster processors is one way to accomplish such processing. Additional power savings may be achieved through improvements in sensors and associated signal processing.

Another approach is compressive sensing. Compressive sensing, in general, is a technique for reducing the bandwidth required for a signal, at the expense of more complex (and potentially power hungry) sparse optimization. As such, using compressive sensing, the amount of data acquired and/or processed can be reduced, though, the processing required generally increases. Therefore, using compressive sensing, though beneficial or even necessary in some situations, can adversely affect the goal of saving energy/power.

In certain electro-magnetic signal processing applications (e.g., electronic intelligence (ELINT) applications, radar systems, cellular communication applications, etc.), where both power savings and performance may be important, it is necessary to detect and locate signals covering a wide bandwidth, and originating from a few sources in the far field of a linear phased array. For short coherent dwells, it is observed that these signals typically occupy a sparse set of frequencies, reflecting the fact that transmitters hop among frequencies and therefore occupy only a small subset of the full band at any given time. The signals also occupy a sparse set of angles, corresponding to the fact that there are typically only a few active transmitters.

One approach is to try to locate the angles of the transmitters first, then apply wideband processing at those angles to retrieve the spectra. Another approach is to perform sparse reconstruction in the frequency domain, then perform narrowband angle determination only at the narrow bands that show up in the spectrum. In some situations, these approaches are too slow. Moreover, the energy consumed in this two-step techniques can make them unsuitable for some applications.

SUMMARY

In various embodiments, power efficiency gains in data intensive signal processing applications can be realized by applying sparsity-based signal processing implemented as a convex optimization such as Second Order Cone Program (SOCP). In particular, various embodiments described herein feature joint determination of angle and frequency in a signal environment that is jointly sparse in the angle-frequency domain. This achieved, in part, using compressive sensing and a phase functional/relation mapping a representation of the collected samples in a time-distance space to an angle-frequency space. A new solver based on embedded convex optimization is then applied to determine angles and frequencies of transmission. In various embodiments, the joint determination of angle and frequency can reduce the number of computations relative to other techniques. As such, the combined sensing of the transmitted signals and the joint determination of angles and frequencies may require significantly lower power, and can be performed in a short time relative to other techniques.

Accordingly, in one aspect a method is provided for determining angle and frequency of transmission from a transmitter. The method includes receiving during a current coherent dwell, sensor data including a first set of samples. The first set of samples includes N samples collected at each one of D sensors, where N, D, or both are greater than one. The method also includes selecting a second set of M samples from the first set of samples, where M is less than N times D. The method further includes determining angle and frequency of transmission of a transmitter by minimizing l1 norm of the second set of M samples. This includes applying a solver to a product of: (i) a phase functional representing a mapping between a time-distance representation of sensor samples and angle-frequency representation thereof, and (ii) the second set of M samples.

In some embodiments, the first set of samples corresponds to a single coherent dwell. The number N may be number of Nyquist intervals in a single coherent dwell. In some embodiments, the first set of samples includes a first sample that is collected by a particular sensor from the D sensors, and that is associated with a transmission at a first frequency. The first set of samples also includes a second sample, also collected by that particular sensor, and that is associated with a transmission at a second, different frequency.

Selecting the second set of M samples from the first set of samples may include filtering the first set of samples using a pseudorandom selector. Alternatively, selecting the second set of M samples from the first set of samples may include ranking the first set of samples according to respective signal-to-noise ratios (SNRs) associated with each sample, and selecting samples corresponding to the M highest ranks.

In some embodiments, the solver includes a second order cone programming (SOCP) solver. Applying the SOCP solver may include providing to the SOCP solver a frequency angle solution obtained from samples collected during another coherent dwell prior to the current coherent dwell.

In another aspect, a method is provided for determining angle and frequency of transmission from a transmitter. The method includes obtaining during a current coherent dwell, using a pseudorandom selector, a set of M samples. These samples are collected from a sensor array including D sensors, each of which is configured collect a sample during each one of N different sampling periods in one coherent dwell. At least one of N and D is greater than one, and, M is less than N times D. The method also includes determining angle and frequency of transmission of a transmitter by minimizing l1 norm of the set of M samples by applying a solver to a product of: (i) a phase functional representing a mapping between a time-distance representation of sensor samples and angle-frequency representation thereof, and (ii) the set of M samples.

In some embodiments, obtaining the set of M samples includes selecting using the pseudorandom selector one or more of the N sampling periods. For each selected sampling period, the method includes obtaining a sample from one or more of the D sensors. The method also includes (i) selecting one or more of the N sampling periods during each of which a sample is not obtained, or (ii) during at least one of the selected sampling periods, selecting one or more of the D sensors from which a sample is not obtained, or both. Thus, collection of samples involves either: (a) having some sampling periods in which no samples are collected; or (b) in the sampling period(s) in which samples are collected, collecting samples from one or more but not all D sensors; or both (a) and (b).

For each selected sampling period, obtaining a sample from one or more of the D sensors may include rejecting a sample from a sensor if a signal-to-noise ratio (SNR) associated with that sample is less than a specified threshold. In some embodiments, the set of M samples may include a first sample associated with a transmission at a first frequency, and a second sample associated with a transmission at a second, different frequency. The solver may include a second order cone programming (SOCP) solver, and applying the SOCP solver may include providing to the SOCP solver a frequency angle solution obtained from samples collected during another coherent dwell prior to the current coherent dwell.

In another aspect, a system for determining angle and frequency of transmission from a transmitter includes a first processor and a first memory in electrical communication with the first processor. The first memory includes instructions which, when executed by a processing unit that may include the first processor and/or a second processor and that is coupled to a memory module include either the first memory or a second memory, or both, program the processing unit to receive in the memory module, during a current coherent dwell, sensor data including a first set of samples. The first set of samples includes N samples collected at each one of D sensors. At least one of N and D is greater than one. The processing unit is also programmed to select a second set of M samples from the first set of samples, where M is less than N times D. In addition, the processing unit is programmed to determine angle and frequency of transmission of a transmitter by minimizing $l_1$-norm of the second set of M samples. To this end, the processing unit is programmed to solve an underdetermined linear system based on a product of: (i) a phase functional representing a mapping between a time-distance representation of sensor samples and angle-frequency representation thereof, and (ii) the second set of M samples. In various embodiments, the instructions can program the processing unit to perform one or more of the method steps described above.

In another aspect, a system for determining angle and frequency of transmission from a transmitter includes a sensor array having D sensors, each of which is configured collect a sample during each one of N different sampling periods in one coherent dwell. At least one of N and D is greater than one. The system also includes a pseudorandom selector adapted to obtain, during a current coherent dwell, a set of M samples, where M is less than N times D. In addition, the system includes a processor configured for determining angle and frequency of transmission of a transmitter by minimizing l1 norm of the plurality of M samples by solving an underdetermined linear system based on a product of: (i) a phase functional representing a mapping between a time-distance representation of sensor samples and angle-frequency representation thereof, and (ii) the set of M samples.

To obtain the plurality of M samples, the pseudorandom selector may be adapted to select at least one of the N sampling periods and, for each selected sampling period, obtain a sample from at least one of the D sensors. Moreover, the pseudorandom selector may (i) select one or more of the N sampling periods during each of which a sample is not obtained, and/or (ii) during at least one of the selected sampling periods, select one or more of the D sensors from which a sample is not obtained. In some embodiments, the pseudorandom selector is further adapted to reject a sample from a sensor if a signal-to-noise ratio (SNR) associated with that sample is less than a specified threshold.

The set of M samples may include a first sample associated with a transmission at a first frequency, and/or a second sample associated with a transmission at a second, different frequency. To solve the underdetermined linear system the processor may be further programmed as a second order cone programming (SOCP) solver. In some embodiments, the processor is further programmed to provide to the SOCP solver a frequency angle solution obtained from samples collected during another coherent dwell prior to the current coherent dwell.

In another aspect, an article of manufacture that includes a non-transitory storage medium has stored therein instructions which, when executed by a processing unit program the processing unit, which is in electronic communication with a memory module, to receive in the memory module, during a current coherent dwell, sensor data including a first set of samples. The first set of samples includes N samples collected at each one of D sensors. At least one of N and D is greater than one. The processing unit is also programmed to select a second set of M samples from the first set of samples, where M is less than N times D. In addition, the processing unit is programmed to determine angle and frequency of transmission of a transmitter by minimizing $l_1$-norm of the second set of M samples. To this end, the processing unit is programmed to solve an underdetermined linear system based on a product of: (i) a phase functional representing a mapping between a time-distance representation of sensor samples and angle-frequency representation thereof, and (ii) the second set of M samples. In various embodiments, the instructions can program the processing unit to perform one or more of the method steps described above.

BRIEF DESCRIPTION OF THE DRAWINGS

Various embodiments of the present invention taught herein are illustrated by way of example, and not by way of limitation, in the figures of the accompanying drawings, in which.

DETAILED DESCRIPTION

Sensor Subsystem of a Data Acquisition System

In one embodiment, using a modified signal sampling approach, the entire processing chain of a conventional data acquisition system was replaced with a single compressive reconstruction operation over the operating band. This was facilitated, in part, due to an approximately 10:1 random undersampling of the time series. As an example of this advantage, the 1 GHz X-band complex sampling rate is effectively reduced to 100 MHz, a rate that can be accommodated with analog to digital converters (ADCs) that are within the state of the art. Another benefit of this sampling scheme from a sensor power perspective is that the entire array is used as a multi-element sensor. This development has a favorable impact on power consumption both at the sensor and in the signal processor. This benefit generally increases in proportion to the number of elements in the array.

Figure 1:
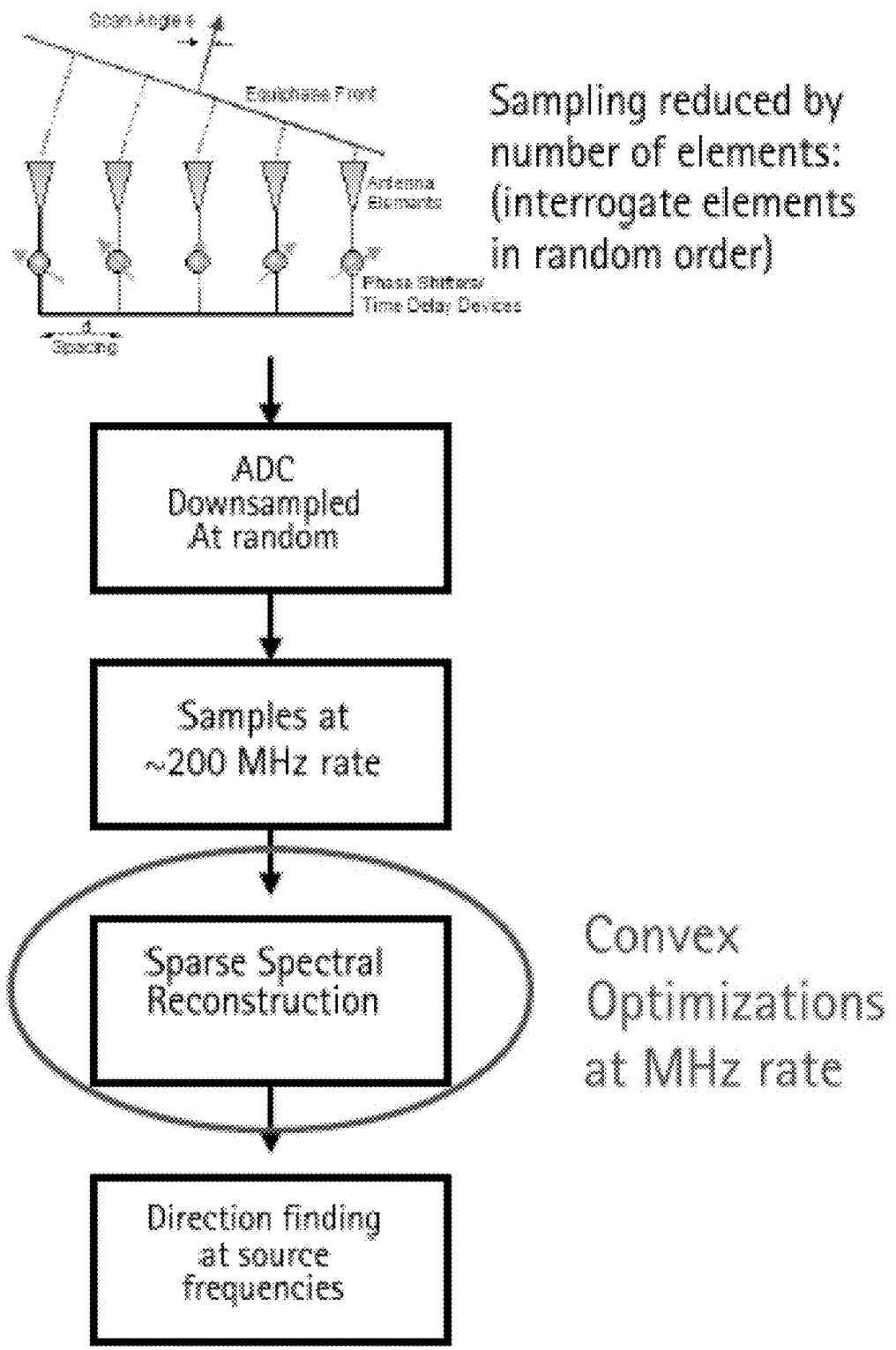
FIG. 1 schematically depicts an electromagnetic data acquisition and processing system, according to one embodiment.

With reference to FIG. 1, rather than sampling with a separate ADC behind each sensor element, sampling is accomplished by receiving signals from each array element using a long pseudo-random permutation of the element indices. The result is that only one of the array elements provides a sample at a given Nyquist opportunity, these samples being recombined in the ADC to obtain a full spectrum. In addition to this, the entire sequence may be downsampled to about 10% of the Nyquist rate. This combination of effects, multi-element operation and compressed sensing can reduce the required number of analog to digital conversions from 400 in a baseline sub-banding design to as few as one analog to digital conversions per 1 GHz of bandwidth.

Signal Processing

The signal processing according to one embodiment includes determining wideband ambient spectra at MHz rate, using all of the (e.g., 6, 8, 16, 20, etc.) sensor elements in a joint fashion. In some embodiments, this is accomplished using a fast embedded second-order cone solver (SOCP). It should be pointed out that the problem to be solved for complex spectral sparsity is different than the problem of real $1_1$ minimization typically addressed in conventional compressed sensing, because the $1_1$ norm of a complex signal is the sum of moduli $\sqrt{I^2+Q^2}$ of the complex signal, and not merely the sum of absolute values as in the case of conventional compressed sensing. The SOCP solver can perform convex optimization.

Measurement Basis

The formal structure of coherent imaging is the same regardless of the physical space to be analyzed. Therefore, a physical model of the phase of the I&Q data at the sensor in terms of certain physical parameters is employed. In general, the phase of an incoming signal depends on sample time and the array element at which the sample is collected, which forms a discrete measurement space, and on certain continuous model parameters, which include wideband frequency f and angle-of-arrival θ.

Notation

The symbol $|x\rangle$ with any letter or some other descriptive label inside represents a complex column vector or 'ket'. The corresponding symbol $\langle x|$, or 'bra' with the same label represents the Hermitian conjugate (row vector) formed by transposing the column vector $|x\rangle$ and taking the complex conjugate of each of the elements. A matrix is denoted by a capital letter (e.g., A or A). The complex conjugate transpose of a matrix A is denoted by $A^H$, the complex conjugate by $A^*$ and the transpose by $A^T$. In complex linear algebra, one most often sees $A^H$.

The product of vector $|x\rangle$ and matrix A is written $A|x\rangle$. For the rules of bilinear algebra to hold, the matrices should be square. An exception is an expression in which we know that one column or row is longer than the other. The matrix is then non-square. We generally consider square matrices and row and column vectors of a particular dimension. The product of a row vector with a square matrix is another row vector $\langle x|A$.

A vector space of dimension N has a standard basis $\{|1\rangle, |2\rangle \ldots |n\rangle : n \in 1 \ldots N\}$. A ket $|n\rangle$ in the standard basis is just a column vector with a '1' in position n and zeros in the other positions. Based on the definitions of the symbols, a symbol that looks like a closed bracket $(a|b)$ represents a complex number. A symbol that looks like an open bracket $|b\rangle\langle a|$ represents a matrix.

Two important identities are $$\langle a|b\rangle = \langle b|a\rangle^*$$

and $$|b\rangle\langle a| = \{|a\rangle\langle b|\}^H$$

The $n^{th}$ element of a column vector $|x\rangle$ can be written as $\langle n|x\rangle$, and the element A(n, m) of a matrix A can be written as $\langle m|A|n\rangle$. A useful formula that follows from the definition of the standard basis symbols is $$\sum_{n=1}^{N} |n\rangle\langle n| = 1$$

where 1 denotes the unit matrix.

Analysis

The complex measurement at a given Nyquist sampling interval in a given element can be denoted as:

$$\{z(t,e): t \in 1 \ldots N, e \in 1 \ldots D\}$$

where N is the number of Nyquist sampling intervals in the coherent dwell and D is the number of elements in the uniform linear array (ULA). Using the notation above, we can write:

$$z(t,e) = \langle t, e | z \rangle$$

which can express the entire set of measurements as a vector $|z\rangle$ in a certain basis $|t, e\rangle$.

This basis is just a set of vectors of length N×D that contains a 1 in the position corresponding to a given pair (e, t) and a 0 otherwise. This definition of the basis can be written compactly as $$\langle t', e' | t, e \rangle = \delta(t', t)\delta(e', e)$$

$$\sum_{t=1}^{N} \sum_{e=1}^{D} |t, e\rangle\langle t, e| = 1$$

One point of view is that we are implicitly introducing a single index n that runs over all of the ordered pairs (t, e). In order to satisfy the equation above, it is only necessary that this index count each basis vector $|t, e\rangle$ exactly once, but this is determined by the equation above only up to a permutation of the indeces n. A common choice for this permutation is to number the N×D basis vectors $\langle t, e | z \rangle$ by starting with the first array element, going through all N sample times, moving to the next element, and so on. According to this prescription, the relationship between n and (t, e) is $$n(t,e) = N(e-1) + t$$

With inverse $$t(n) = \mod(n-1, N) + 1$$

$$e(n) = \frac{n - t(n)}{N} + 1$$

An alternate block enumeration of the basis vectors is to start with the first sample time, visit each of the array elements in turn, then move to the next sample time and continue in that pattern. The mapping is similar $$n(t,e) = D(t-1) + e$$

With inverse $$e(n) = \mod(n-1, D) + 1$$

$$t(n) = \frac{n - e(n)}{D} + 1$$

The basis vectors $|t, e\rangle$ can be put in any order, as long as the indeces (t, e) are carried along with the corresponding I&Q measurement. An alternative permutation that is less arbitrary than the block styles of enumeration is to sort the list of complex measurements in descending order according to their absolute magnitudes $\lambda(t, e) = \langle \langle z|t, e\rangle \langle t, e|z\rangle$ This ordering simplifies some of the bookkeeping, since it is now only necessary to place a zero in the list wherever a measurement is not present, prior to sorting and truncating the list at M×D entries. Even in the case where all N×D measurements are present, those with the smallest magnitudes, or with magnitudes smaller than a certain threshold (say zero dB relative to a noise floor) might reasonably be neglected. This procedure appears to be more satisfactory conceptually than eliminating pulses at random, but it requires that a given sample be examined before it is retained or dropped, so there is an impact on the sensor design. There is a physical impact, since in a batch application measurements with the highest single pulse SNR can be retained and those with lower SNR dropped.

Once the order of the basis vectors $|t, e\rangle$ is chosen, as long as the function (t, e)<=>n is remembered, the equation (presented above)

$$\langle t', e' | t, e \rangle = \delta(t', t)\delta(e', e)$$

$$\sum_{t=1}^{N} \sum_{e=1}^{D} |t, e\rangle\langle t, e| = 1$$

can be reduced to the standard form:

$$\langle n' | n \rangle = \delta(n', n)$$

$$\sum_{n=1}^{ND} |n\rangle\langle n| = 1.$$

The symbols $|(n)\rangle$ and $|t, e\rangle$ can be used interchangeably, since $|(n)\rangle = |t(n), e(n)\rangle$.

This may be true regardless of how many indeces were needed to describe the measurement space. Additional indeces occur in applications involving wideband pulsed radar or multistatic radar, for example.

Phase Functional

We express the phase at each antenna element and each sample time as a function of some set of model parameters. In the general case, we specify the physical phase as a function of the measurement index and some continuous parameters q. The parameters in this case are the wideband frequency f and the angle of incidence θ.

Assume a uniform linear array consisting of D elements spaced at intervals Δ. If we choose coordinates such that the x-axis runs along the array and the y-axis is normal to the array, the center of coordinates lying at the geometrical center of the array, the vector positions e of the D array elements are:

$$e = \Delta\left(e - \frac{D+1}{2}\right)\hat{x}$$

Where $\{e \in 1 \ldots D\}$ are integer indeces corresponding to each of the array elements. The position of a source at range R and angle θ off boresight of the array is $$s = R(\sin\theta\hat{x} + \cos\theta\hat{y})$$

The phase of a plane wave of frequency f emitted from the source at Nyquist interval $\{t \in 1 \ldots N\}$ is $$\phi(t, e | f, \theta) = 2\pi f\left(\frac{(t-1)}{B} - \frac{|s - e|}{c}\right)$$

If the source is in the far-field of the array, $|e|\ll R$. Expanding the distance to leading order in the small quantity $|e|/R$, $$|s-e| = \sqrt{(s-e)\cdot(s-e)} = \sqrt{R^2 + |e|^2 - 2e\cdot s} \cong R + \Delta\left(e - \frac{D+1}{2}\right)\sin\theta.$$

Neglecting an overall constant $$\phi(t, e \mid f, \theta) = 2\pi f\left[\frac{(t-1)}{B} - \frac{\Delta}{c}\left(e - \frac{D+1}{2}\right)\sin\theta\right]$$

Image in the (f, θ) Domain

Define a complex phase correction vector with components $$\langle t, e | f, \theta \rangle = e^{-\phi(t,e|f,\theta)}$$

where the functional $\phi(t, e|f, \theta)$ of the radar measurement $|z\rangle$ is given above as:

$$\phi(t, e \mid f, \theta) = 2\pi f\left[\frac{(t-1)}{B} - \frac{\Delta}{c}\left(e - \frac{D+1}{2}\right)\sin\theta\right]$$

The real, positive-definite function $$\sigma(f, \theta) = \langle z | f, \theta \rangle \langle f, \theta | z \rangle, f \in \left(-\frac{B}{2}, +\frac{B}{2}\right), \theta \in (-\pi, +\pi)$$

qualifies as the image of the measured data in the coordinate space (f, θ) in the following sense: If the data are consistent with the phase model and with the values (f, θ) of the parameters, the function will have a local maximum, on account of the coherent addition of terms. This property is not changed if a real-valued positive weighting function w (f, θ) is included on the right. The function σ(f, θ) can be normalized to represent a probability density, the likelihood p (z|f, θ) of the measurement given the model parameters (f, θ).

These definitions are formal from the viewpoint of computation, since a continuous function of several variables cannot be computed or represented directly. However, there is no necessary relationship between the way the continuous function in the equation above is represented and the discrete character of the sensor measurements. One may represent a function as a set of coefficients corresponding to a linear superposition in some basis. According to the Shannon-Nyquist theorem, a function of finite bandwidth and finite duration can be represented exactly as a linear superposition in a finite basis of sine functions. A function with a different property might be represented compactly in a different way. For example, a function that admits an exact description in terms of an all-poles model of a definite order can be represented exactly via a set of autoregressive coefficients. A function that is known to be truly sparse in the image domain may likewise be represented more compactly than it would be via the coefficients of a Fourier expansion, as a superposition of impulse functions.

Jointly Sparse Reconstruction

To carry out the algebraic sparse reconstruction program in the joint domain, a set of samples in the (f, θ) plane/space is computed using the equation above. These samples may be more numerous than the measurements. The number and locations of these samples are not fixed. A uniform sampling in both dimensions of the image space is taken, in various embodiments. We may take the number of samples in the frequency dimension to be F×N and the number of samples in the angle dimension E×D. This accounts for the possibility of superresolution in both dimensions of the image. The number of sample points in the image is K=F×N×E×D. We can associate each point with an index $\{k \in 1 \ldots K\}$. As in the case of the basis $n \Leftrightarrow (t, e)$, the order is not important, as long as the mapping $k \Leftrightarrow (f_k, \theta_k)$ is remembered.

Let the image vector be expressed as $$\langle \sigma | k \rangle \langle k | \sigma \rangle = \sigma(f_k, \theta_k)$$

The coefficient matrix can be $\langle k|A|n\rangle = \langle t, e|f_k, \theta_k\rangle$. We thus have a linear system as:

$$\tilde{z} = A^H \sigma$$

where the dimension of $|\sigma\rangle$ is K×1, the dimension of A is K×M, and the dimension of $|z\rangle$ is M×1, Here, $\tilde{z}$ are samples that are actually collected and/or processed, and M is the actual number of samples selected for processing, where M<N×D. In some embodiments, M is 10%, 15%, 20% etc., of the total number of available samples (N×D). The system of linear equations is underdetermined, but the sparsest solution in both frequency and angle can be found by minimizing the $l_1$-norm of $|\sigma\rangle$ subject to the equation above. This optimization can be cast as a Second-order cone program (SOCP), and solved for the jointly sparse spectrum.

Complex $l_1$-Minimization

Modeling languages including CVX and YALMIP can solve complex $l_p$-norm minimization programs by converting them to real Second Order Cone Programs (SOCP). These programs can then be solved with specialized SOCP solvers. The process of transforming the program into canonical SOCP form is transparent within the framework of the modeling language. But it is useful to make this transformation explicit when the need arises to use the SOCP solver source code directly. Let the complex-valued optimization program be Minimize$\|F\|_1$ subject to $A|F\rangle = |z\rangle$ Define a real row vector $$\langle c| = [100 \ldots 100]$$

of length 3N, where N is the length of the complex vector $|F\rangle$. Define a real column vector of length 3N $$|S\rangle = [t_1 Re F_1 Im F_1 \ldots t_N Re F_N Im F_N]^T$$

where the N quantities $\{t_n\}$ represent bounds on the amplitudes of the N elements of the unknown spectrum $|F\rangle$.

Define a real coefficient matrix $$H = \begin{bmatrix} 0 \\ Re\langle A(1)| \circ Im\langle A(1)| \\ -Im\langle A(1)| \circ Re\langle A(1)| \\ \vdots \\ 0 \\ Re\langle A(M)| \circ Im\langle A(N)| \\ -Im\langle A(M)| \circ Re\langle A(N)| \end{bmatrix}$$

where $\langle A(n)|$ denotes the $n^{th}$ row of the matrix A, and two row vectors when written like $\langle a| \circ \langle b|$ denote the row vector formed by appending the elements of $\langle b|$ to the right of the elements of $\langle a|$ to form a single long row vector. The new matrix H consists of 3N rows containing 2M columns each.

Define a real column vector of length 2M using the same notation for appending two rows $$|X\rangle = [Re\langle z|\cdot Im\langle -z|]^T$$

where $\langle z|=|z\rangle^H$, according to the usual rule.

With these definitions, the complex norm minimization program has been converted to the real program Minimize $\langle c|S\rangle$ subject to $H|S\rangle = |X\rangle$, and $$\sqrt{S_{3n-1}^2 + S_{3n}^2} \leq S_{3n-2}, \{n \in 1 \ldots N\}.$$

The second set of N inequalities in the equation above express constraints on the absolute values of the complex spectrum $|F\rangle$:

$$|F_n| = \sqrt{(ReF_n)^2 + (ImF_n)^2} \leq t_n, \{n \in 1 \ldots N\}$$

These constraints can be interpreted as a second order cone for each n. The problem has been converted into the canonical form of an SOCP, which can now be solved by using any one of several available SOCP solvers.

ELINT Example

A ELINT application was implemented according to different embodiments using synthetic signal structures and an end-to-end sensing and reconstruction simulation. The simulation tracked the number of floating point operations performed. We also accounted for energy savings at the sensor, e.g., antenna inputs and Analog to Digital Converters (ADCs). We compared the results of the different implementations with those previously reported based on a conventional ELINT implementation (also called a baseline or proxy implementation). Improvements in the FLOPS required for the application were observed in implementation according to various embodiments described herein. We also show that power savings of between 5× and 9×, depending on the surveillance band, can be achieved.

The ELINT application is handled in a baseline approach by first breaking the wide band signal behind each of (nominally 16) array elements into 50 MHz narrow bands using a bank of discrete Fourier transform operators (DFTs), then refocussing each of these to a common frequency to construct a single angle-estimation covariance that is used for super-resolved angle estimation using the MUSIC algorithm. The technique with analog subbanding of the wideband signals prior to sampling with a bank of analog-to-digital converters (ADC) behind each element in the uniform linear array is a representative proxy for the signal processing employed in current-generation ELINT systems. The associated signal processing approach is generally known. The roll-up of the estimated computations and associated power requirements for this approach, as shown in Table 1 depicted in FIG. 1, are also generally known.

A useful computational performance metric when making comparisons is the number of floating point operations per complex sample, taken at the Nyquist rate. It is an observation from the baseline results that this number is very nearly constant over all of the frequency bands that were studied, around 20,000 FLOPS per complex sample. As shown in Table 1, estimated power was computed from operation count in GFLOPs/s and the resulting figure was derated to account for other power impacts within the processor.

To establish that these computations can be accomplished in real-time with fewer computations than are required using the baseline approach, statistics were compiled on runtimes for complete optimizations and single iterations of a fast second-order cone program solver carrying out reconstructions of sparse spectra, according to various embodiments.

X-Band Operation Counts

Figures 2, 3:
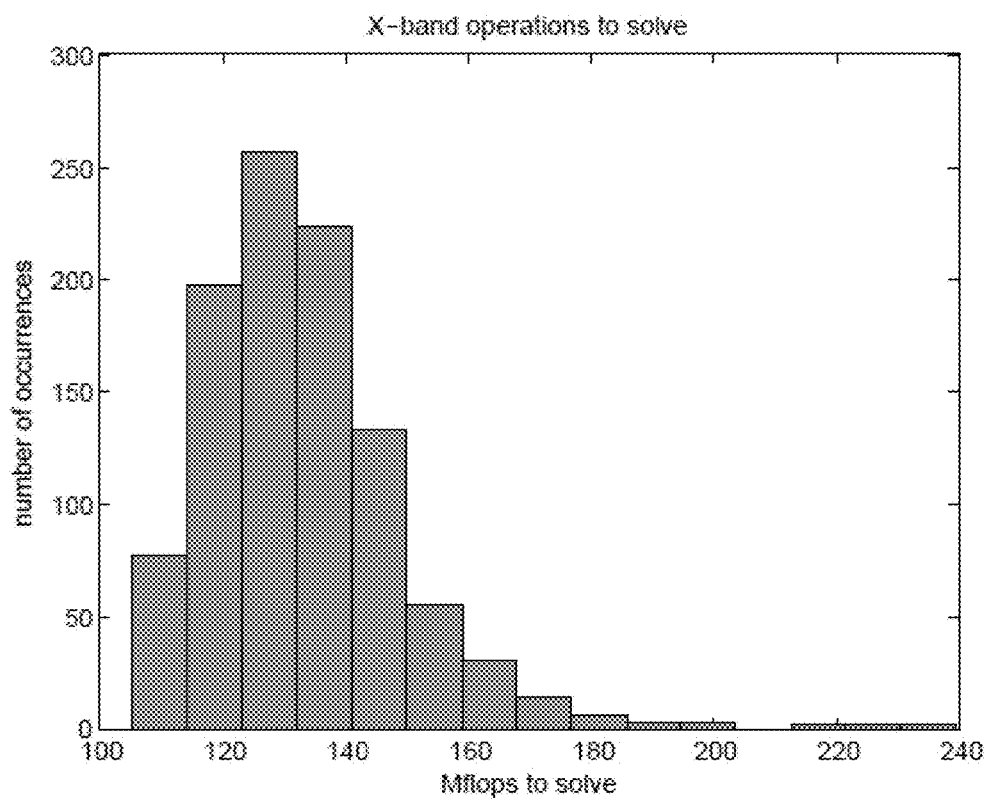
FIG. 2 depicts a table showing a baseline number of operations and corresponding energy consumption associated with analysis of signals in various bands.
FIG. 3 illustrates a histogram of a number of operations associated with analysis of signals in X band, according to one embodiment.
Figure 4:
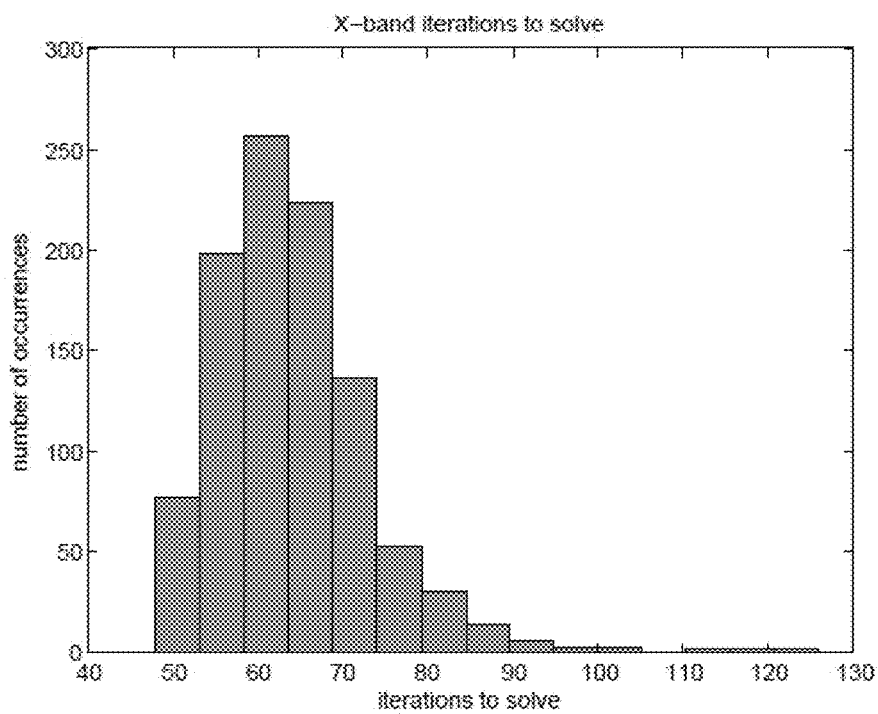
FIG. 4 illustrates a histogram of a number of solver iterations associated with analysis of signals in X band, according to one embodiment.
Figure 5:
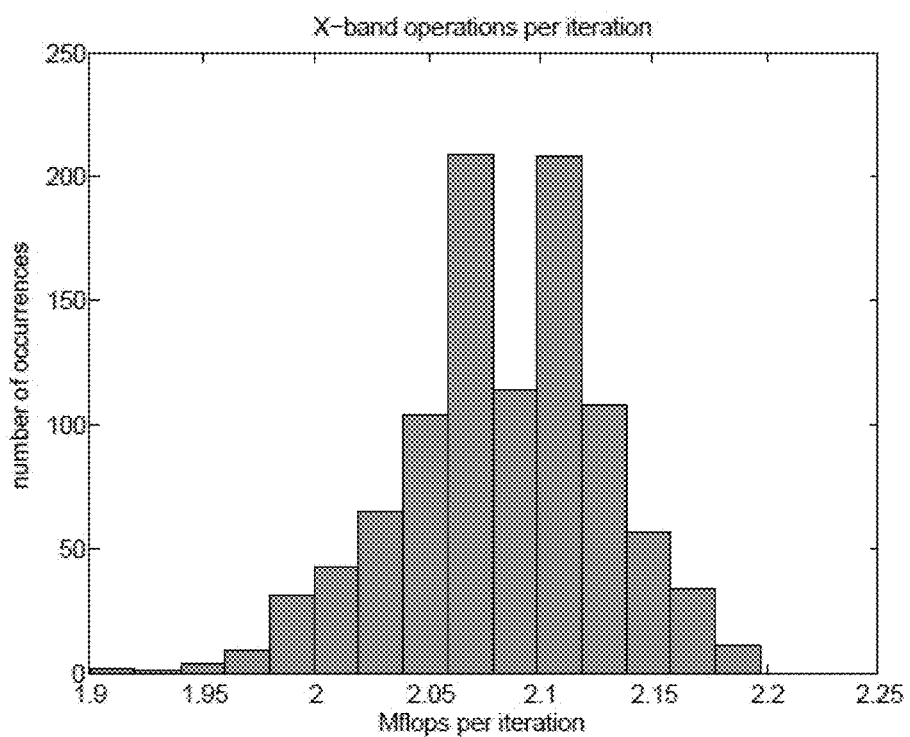
FIG. 5 illustrates a histogram of a number of operations per solver iteration associated with analysis of signals in X band, according to one embodiment.

FIGS. 3, 4, and 5, respectively, are histograms showing the number of operations in MFLOPS associated with one complete spectral reconstruction in a Monte Carlo experiment including 1000 random spectra, the number of iterations of the solver, and number of operations in MFLOPS per iteration. For this analysis, we simulated X-band spectra at 1000 MHz bandwidth, a coherent dwell time of 0.64 microseconds (eight times the coherent integration time of 0.08 microseconds used in proxy example), 640 Nyquist intervals of coherent integration, a downsample factor of 10% and sparsity factor K=5 complex sinusoids.

One of these super-resolved spectra is sufficient per direction-of-arrival computation, since an angular covariance for superressolution angle estimation can be formed from the 16 individual element returns at each detected frequency, rather than from multiple consecutive looks. In some embodiments, active frequencies within the band are isolated first. The time used for purposes of computing the number of Nyquist opportunities (angle-of-arrival time) was taken to be 64 times 0.08 microseconds or 5.12 microseconds, which is designated as the AOA computation time in the proxy. In other embodiments, angle and frequencies are jointly determined as described above.

With reference to FIG. 3, the median operation count for one complete spectral reconstruction during this Monte-Carlo run was 131 MFLOPS, the mean was 133 MFLOPS and the standard deviation was 15.3 MFLOPS. The corresponding computations for the proxy were 19,473 GFLOPS, or 19,472 FLOPS/sample compared to 133 MFLOPS/(640 SAMPLES*64)=3247 FLOPS/sample in this experiment; an improvement factor of 6.

W-Band Operation Counts

Figure 6:
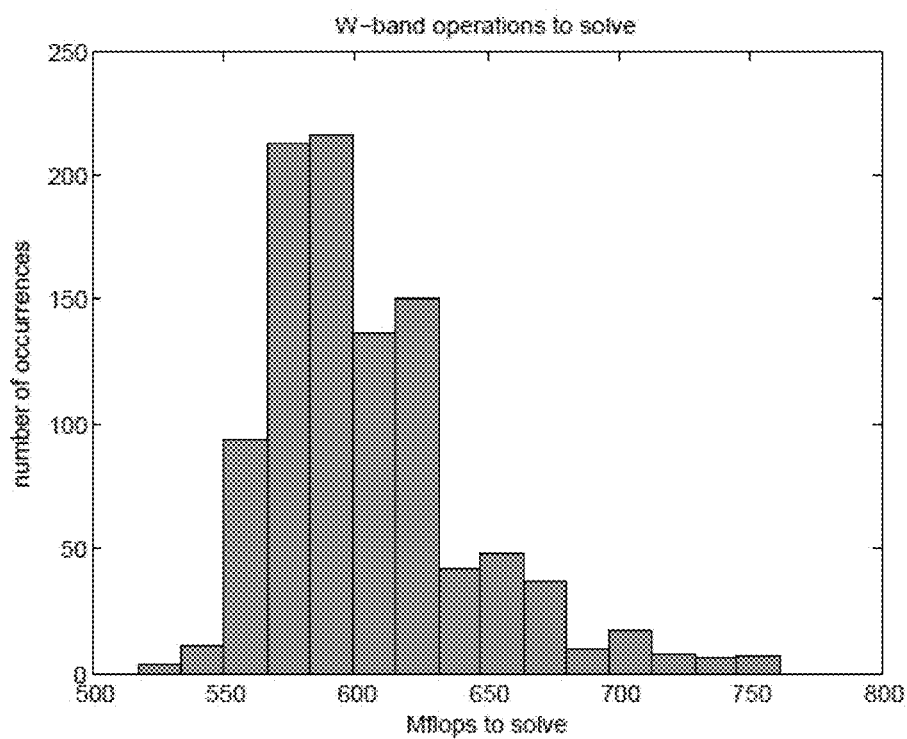
FIG. 6 illustrates a histogram of a number of operations associated with analysis of signals in W band, according to one embodiment.
Figure 7:
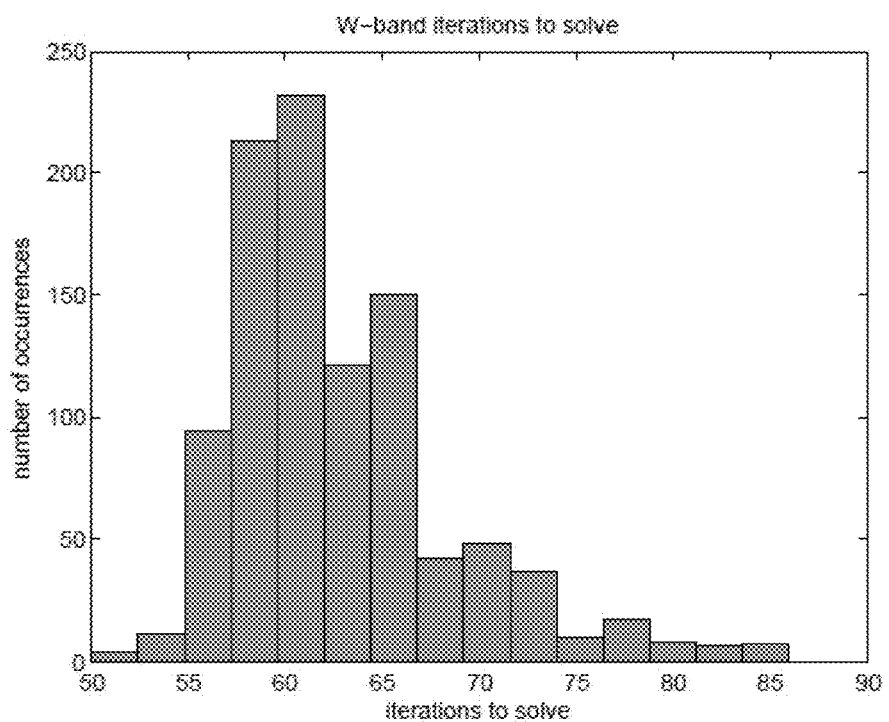
FIG. 7 illustrates a histogram of a number of solver iterations associated with analysis of signals in W band, according to one embodiment.
Figures 8, 9:
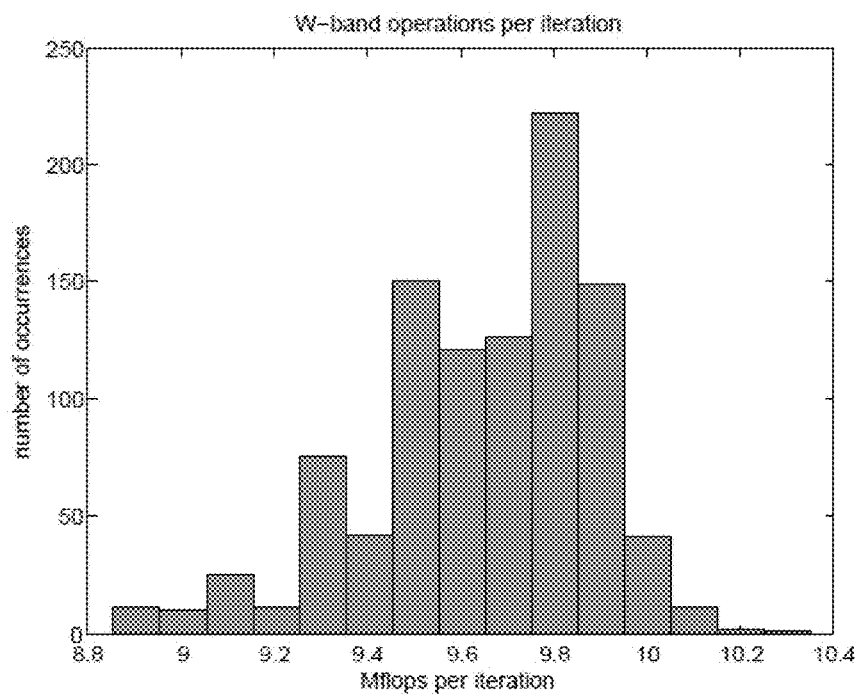
FIG. 8 illustrates a histogram of a number of operations per solver iteration associated with analysis of signals in W band, according to one embodiment.
FIG. 9 depicts a table showing improvements in power consumption associated with analysis of signals in two bands, according to one embodiment.

FIGS. 6, 7, and 8 are histograms showing the number of operations in MFLOPS associated with one complete spectral reconstruction in a Monte Carlo experiment including 1000 random spectra at W-band 4.0 GHz bandwidth, the number of iterations of the solver, and number of operations in MFLOPS per iteration. For this analysis, we simulated W-band spectra at 4000 MHz bandwidth, a coherent dwell time of eight times the coherent integration time of 0.04 microseconds used in proxy example, which gives 1280 Nyquist intervals of coherent integration. As in the X-band case, we used a downsample factor of 10% and sparsity factor K=5 (complex sinusoids). The mean operation count for one complete spectral reconstruction during this Monte-Carlo run was 592 MFLOPS. The corresponding computations for the proxy were 81,090 GFLOPS, or 20,272 GFLOPS/sample compared to a mean of 7227 FLOPS/sample in this experiment; an improvement factor of 2.8.

Net Power Savings

Various implementation described herein provided power savings in both the signal processor and the sensor. These total savings are summarized in Table 2 (depicted in FIG. 9) based on the same assumptions that were used in the baseline. The total power savings factor on the right is computed as the ratio of net total power requirement of the baseline system to net total power requirement of the proposed system for each of two surveillance bands.

Warm Start

Two SOCP solvers, namely, PDOS and SCS have an enhanced capability. Like a simplex solver or a hill-climbing algorithm, they can greatly benefit from prior knowledge in the form of a good initial estimate of the solution, i.e., angle/frequency, in order to converge in only a few iterations. Since the spectra are being computed back-to-back at MHz rates, the change in the spectrum can be slow in some situations, so that this warm start capability can further reduce the number of computations.

Without warm start, the average number of iterations to solution at X-band and W-band are 63 and 114, respectively. The median operation count for a single iteration of PDOS at X-band is 2.1 MFLOPS, and the median operation count for a single iteration of PDOS at W-band is 9.7 MFLOPS. The solvers are likely to converge from a warm start in 10 iterations, resulting in an average speed up by an additional factor of 6 at X-band and an additional factor of 11 at W-band.

Numerical Example

Figure 10:
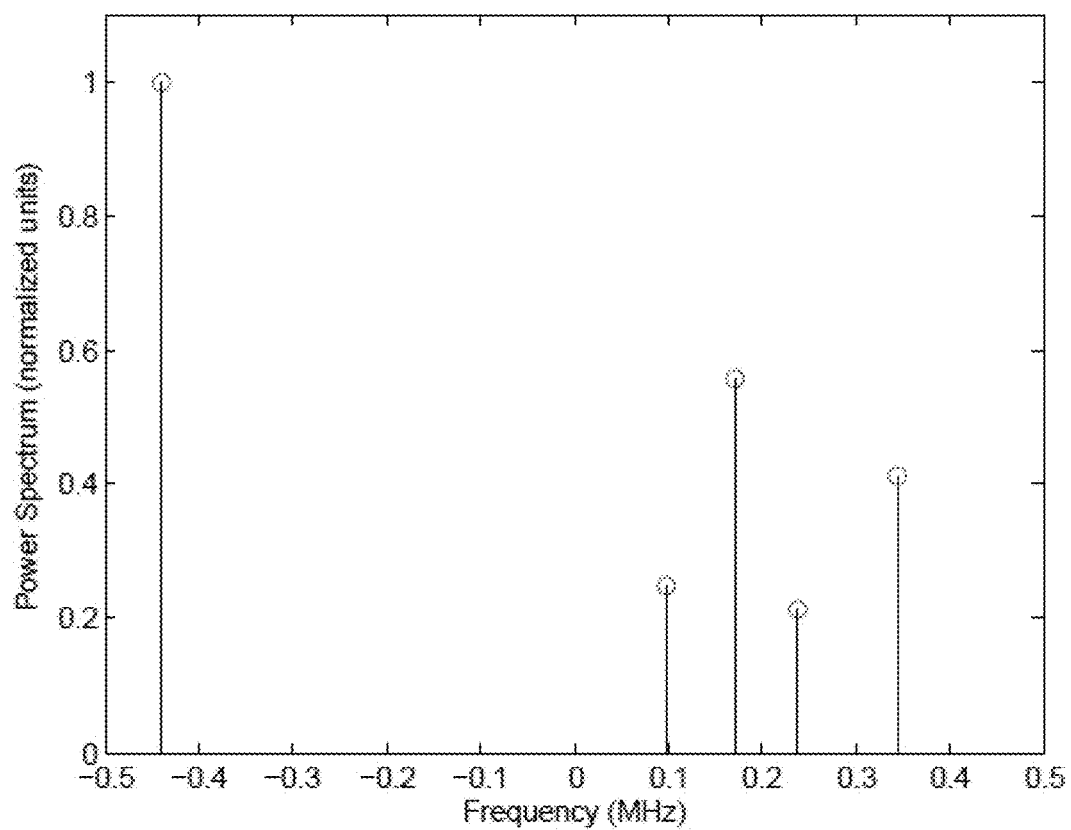
FIG. 10 shows a transmitted power spectrum of an example signal set to be analyzed using various embodiments.

The spectral recovery program via SOCP is solved here for the case of five sinusoidal signals in white noise as an illustrative example. The frequencies and amplitudes of the true sinusoids are indicated in FIG. 10. In addition to the spectral power and frequency indicated in the figure, each signal was assigned a random phase.

A complex IQ time function was formed by superposition of the five sinusoids. In order to simulate the time series for purposes of demonstrating sparse reconstruction, the complex time function was sampled at the Nyquist rate. The resulting time series was then downsampled at random by a factor of 0.1. This means that, in this illustration, 90% of the samples were dropped by the ADC. The effective sampling rate of the ADC was thus reduced to 10% of the Nyquist rate. The block of undecimated time samples was fixed at 1000.

The full Fourier spectrum of the time series was computed prior to decimation, in order to establish a baseline against which to evaluate the performance of sparse reconstruction. The power spectrum resulting from sampling the time signal at the Nyquist rate and calculating the discrete Fourier transform (DFT) (zero-padded by a factor of four to achieve 4:1 interpolation) is shown in FIG. 9. The integrated SNR was set at 20 dB for purposes of this example, and the samples were assumed to have 24 bits of precision, so both receiver noise and quantization noise are negligible in this case. The simulation allows the precision of the samples in bits and the receiver noise in dB to be set independently.

Figure 11:
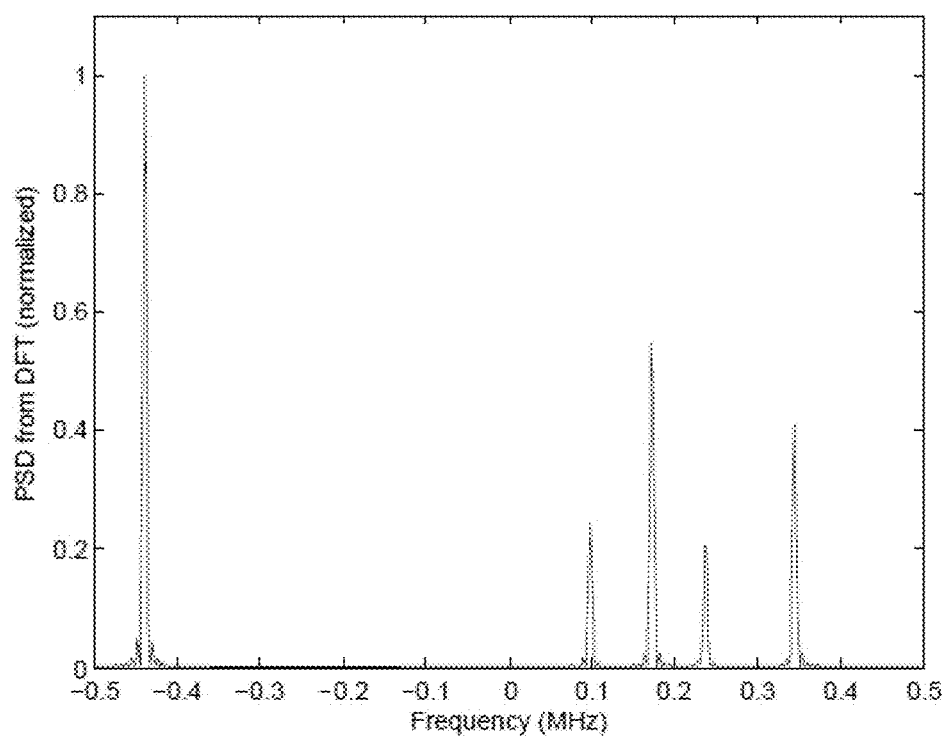
FIG. 11 shows a recovered power spectrum of the example signal set of FIG. 10, without using compressing sensing.
Figure 12:
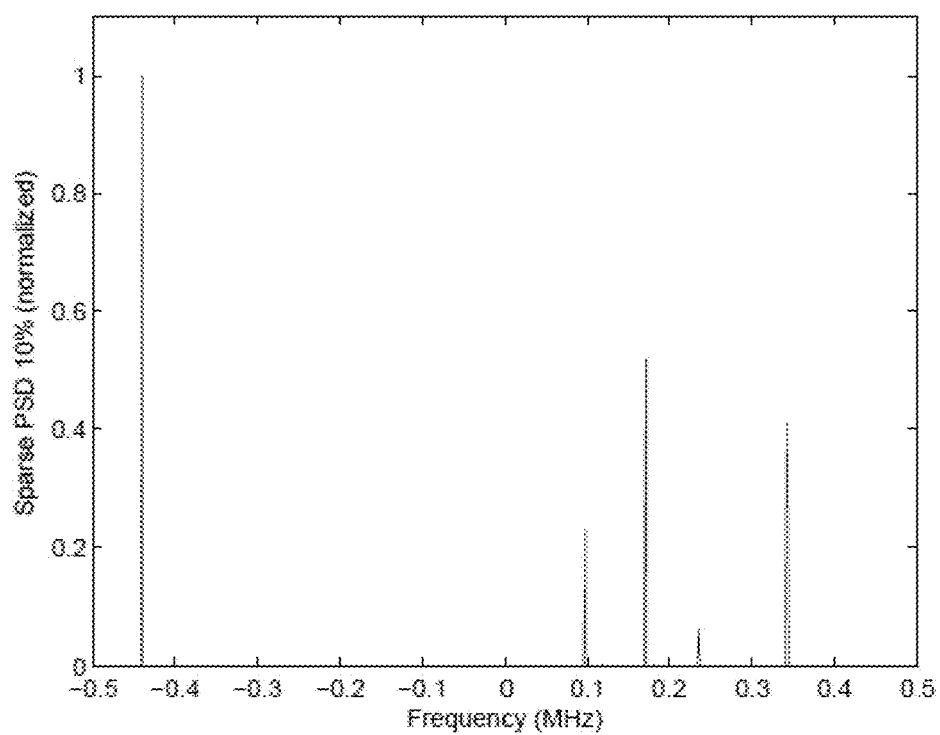
FIG. 12 shows a recovered power spectrum of the example signal set of FIG. 10, using compressing sensing according to one embodiment.

The sinusoids were recovered accurately by Fourier analysis using the full Nyquist sample, as illustrated in FIG. 11. Next, the decimated samples were analyzed using three different versions of the SOCP optimization, namely, sedum, ECOS and PDOS. Similar results were obtained using all three versions. FIG. 12 shows the reconstructed spectrum that resulted from the 90% downsampled data in this case. The spectrum was correctly recovered from the randomly downsampled data. The spectral lines are super-resolved when compared with the Fourier resolution exhibited in FIG. 11.

It is clear that there are many ways to configure the device and/or system components, interfaces, communication links, and methods described herein. The disclosed methods, devices, and systems can be deployed on convenient processor platforms, including network servers, personal and portable computers, and/or other processing platforms. Other platforms can be contemplated as processing capabilities improve, including personal digital assistants, computerized watches, cellular phones and/or other portable devices. The disclosed methods and systems can be integrated with known network management systems and methods. The disclosed methods and systems can operate as an SNMP agent, and can be configured with the IP address of a remote machine running a conformant management platform. Therefore, the scope of the disclosed methods and systems are not limited by the examples given herein, but can include the full scope of the claims and their legal equivalents.

The methods, devices, and systems described herein are not limited to a particular hardware or software configuration, and may find applicability in many computing or processing environments. The methods, devices, and systems can be implemented in hardware or software, or a combination of hardware and software. The methods, devices, and systems can be implemented in one or more computer programs, where a computer program can be understood to include one or more processor executable instructions. The computer program(s) can execute on one or more programmable processing elements or machines, and can be stored on one or more storage medium readable by the processor (including volatile and non-volatile memory and/or storage elements), one or more input devices, and/or one or more output devices. The processing elements/machines thus can access one or more input devices to obtain input data, and can access one or more output devices to communicate output data. The input and/or output devices can include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processing element as provided herein, where such aforementioned examples are not exhaustive, and are for illustration and not limitation.

The computer program(s) can be implemented using one or more high level procedural or object-oriented programming languages to communicate with a computer system; however, the program(s) can be implemented in assembly or machine language, if desired. The language can be compiled or interpreted.

As provided herein, the processor(s) and/or processing elements can thus be embedded in one or more devices that can be operated independently or together in a networked environment, where the network can include, for example, a Local Area Network (LAN), wide area network (WAN), and/or can include an intranet and/or the Internet and/or another network. The network(s) can be wired or wireless or a combination thereof and can use one or more communication protocols to facilitate communication between the different processors/processing elements. The processors can be configured for distributed processing and can utilize, in some embodiments, a client-server model as needed. Accordingly, the methods, devices, and systems can utilize multiple processors and/or processor devices, and the processor/processing element instructions can be divided amongst such single or multiple processor/devices/processing elements.

The device(s) or computer systems that integrate with the processor(s)/processing element(s) can include, for example, a personal computer(s), workstation (e.g., Dell, HP), personal digital assistant (PDA), handheld device such as cellular telephone, laptop, handheld, or another device capable of being integrated with a processor(s) that can operate as provided herein. Accordingly, the devices provided herein are not exhaustive and are provided for illustration and not limitation.

References to "a processor", or "a processing element," "the processor," and "the processing element" can be understood to include one or more microprocessors that can communicate in a stand-alone and/or a distributed environment(s), and can thus can be configured to communicate via wired or wireless communication with other processors, where such one or more processor can be configured to operate on one or more processor/processing elements-controlled devices that can be similar or different devices. Use of such "microprocessor," "processor," or "processing element" terminology can thus also be understood to include a central processing unit, an arithmetic logic unit, an application-specific integrated circuit (IC), and/or a task engine, with such examples provided for illustration and not limitation.

Furthermore, references to memory, unless otherwise specified, can include one or more processor-readable and accessible memory elements and/or components that can be internal to the processor-controlled device, external to the processor-controlled device, and/or can be accessed via a wired or wireless network using a variety of communication protocols, and unless otherwise specified, can be arranged to include a combination of external and internal memory devices, where such memory can be contiguous and/or partitioned based on the application. For example, the memory can be a flash drive, a computer disc, CD/DVD, distributed memory, etc. References to structures include links, queues, graphs, trees, and such structures are provided for illustration and not limitation. References herein to instructions or executable instructions, in accordance with the above, can be understood to include programmable hardware.

Although the methods and systems have been described relative to specific embodiments thereof, they are not so limited. As such, many modifications and variations may become apparent in light of the above teachings. Many additional changes in the details, materials, and arrangement of parts, herein described and illustrated, can be made by those skilled in the art. Accordingly, it will be understood that the methods, devices, and systems provided herein are not to be limited to the embodiments disclosed herein, can include practices otherwise than specifically described, and are to be interpreted as broadly as allowed under the law.

Accordingly, we claim:

1. A method for determining angle and frequency of transmission from a transmitter, the method comprising:
   receiving during a current coherent dwell, sensor data comprising a first plurality of samples, the first plurality of samples comprising N samples collected at a sensor array comprising D sensors, a spacing between a pair of adjacent sensors being Δ;
   selecting a second plurality of M samples from the first plurality of samples, M being less than N times D;
   determining angle and frequency of transmission of a transmitter located at a range R and an angle θ relative to a plane of the sensor array and transmitting a signal at a frequency f, by minimizing using a solver, an l1 norm of a product of: (i) a phase functional representing a mapping between time-distance and angle-frequency representations of sensor samples and (ii) the second plurality of M samples, the time-distance representation being based on the spacing Δ, and the angle-frequency representation being based on θ and f.

2. The method of claim 1, wherein the first plurality of samples corresponds to a single coherent dwell.

3. The method of claim 1, wherein N is a number of Nyquist intervals in a single coherent dwell.

4. The method of claim 1, wherein the first plurality of samples comprises:
   a first sample, collected by a particular sensor from the D sensors, and associated with a transmission at a first frequency; and
   a second sample, collected by that particular sensor, and associated with a transmission at a second, different frequency.

5. The method of claim 1, wherein selecting the second plurality of M samples from the first plurality of samples comprises filtering the first plurality of samples using a pseudorandom selector.

6. The method of claim 1, wherein selecting the second plurality of M samples from the first plurality of samples comprises:
   ranking the first plurality of samples according to respective signal-to-noise ratios (SNRs) associated with each sample; and
   selecting samples corresponding to the M highest ranks.

7. The method of claim 1, wherein the solver comprises a second order cone programming (SOCP) solver.

8. The method of claim 7, wherein applying the SOCP solver comprises providing to the SOCP solver a frequency angle solution obtained from samples collected during another coherent dwell prior to the current coherent dwell.

9. A method for determining angle and frequency of transmission from a transmitter, the method comprising:
   from a sensor array comprising D sensors, each of which is configured collect a sample during each one of N different sampling periods in one coherent dwell, and a spacing between a pair of adjacent sensors being Δ, obtaining during a current coherent dwell, using a pseudorandom selector, a plurality of M samples, M being less than N times D;
   determining angle and frequency of transmission of a transmitter located at a range R and an angle θ relative to a plane of the sensor array and transmitting a signal at a frequency f, by minimizing using a solver, an l1 norm a product of: (i) a phase functional representing a mapping between time-distance and angle-frequency representations of sensor samples and (ii) the plurality of M samples, the time-distance representation being based on the spacing Δ, and the angle-frequency representation being based on θ and f.

10. The method of claim 9, wherein obtaining the plurality of M samples comprises:
    selecting using the pseudorandom selector at least one of the N sampling periods;
    for each selected sampling period, obtaining a sample from at least one of the D sensors; and
    at least one of:
    (i) selecting at least one of the N sampling periods during each of which a sample is not obtained; and
    (ii) during at least one of the selected sampling periods, selecting at least one of the D sensors from which a sample is not obtained.

11. The method of claim 10, wherein for each selected sampling period, obtaining a sample from at least one of the D sensors comprises rejecting a sample from a sensor if a signal-to-noise ratio (SNR) associated with that sample is less than a specified threshold.

12. The method of claim 9, wherein the plurality of M samples comprises at least:
    a first sample associated with a transmission at a first frequency; and
    a second sample associated with a transmission at a second, different frequency.

13. The method of claim 9, wherein the solver comprises a second order cone programming (SOCP) solver.

14. The method of claim 13, the processor is further programmed to provide to the SOCP solver a frequency angle solution obtained from samples collected during another coherent dwell prior to the current coherent dwell.

15. The method of claim 13, wherein applying the SOCP solver comprises providing to the SOCP solver a frequency angle solution obtained from samples collected during another coherent dwell prior to the current coherent dwell.

16. A system for determining angle and frequency of transmission from a transmitter, comprising:
   a first processor; and
   a first memory in electrical communication with the first processor, the first memory comprising instructions which, when executed by a processing unit comprising at least one of the first processor and a second processor, and in electronic communication with a memory module comprising at least one of the first memory and a second memory, program the processing unit to:
   receive in the memory module, during a current coherent dwell, sensor data comprising a first plurality of samples, the first plurality of samples comprising N samples collected at a sensor array comprising D sensors, a spacing between a pair of adjacent sensors being $\Delta$;
   select a second plurality of M samples from the first plurality of samples, M being less than N times D; and
   determine angle and frequency of transmission of a transmitter located at a range R and an angle $\theta$ relative to a plane of the sensor array and transmitting a signal at a frequency f, by minimizing an l1 norm of the second plurality of M samples by solving an underdetermined linear system comprising a product of: (i) a phase functional representing a mapping between time-distance and angle-frequency representations of sensor samples and (ii) the second plurality of M samples, the time-distance representation being based on the spacing $\Delta$, and the angle-frequency representation being based on $\theta$ and f.

17. The system of claim 16, wherein the first plurality of samples corresponds to a single coherent dwell.

18. The system of claim 16, wherein N is a number of Nyquist intervals in a single coherent dwell.

19. The system of claim 16, wherein the first plurality of samples comprises:
   a first sample, collected by a particular sensor from the D sensors, and associated with a transmission at a first frequency; and
   a second sample, collected by that particular sensor, and associated with a transmission at a second, different frequency.

20. The system of claim 16, wherein for selecting the second plurality of M samples from the first plurality of samples, the processing unit is further programmed to filter the first plurality of samples using a pseudorandom selection.

21. The system of claim 16, wherein for selecting the second plurality of M samples from the first plurality of samples, the processing unit is further programmed to:
   rank the first plurality of samples according to respective signal-to-noise ratios (SNRs) associated with each sample; and
   select samples corresponding to the M highest ranks.

22. The system of claim 16, wherein to solve the underdetermined linear system the processing unit is further programed as a second order cone programming (SOCP) solver.

23. The system of claim 22, wherein the processing unit is further programmed to provide to the SOCP solver a frequency angle solution obtained from samples collected during another coherent dwell prior to the current coherent dwell.

24. A system for determining angle and frequency of transmission from a transmitter, comprising:
   a sensor array comprising D sensors, each of which is configured collect a sample during each one of N different sampling periods in one coherent dwell, a spacing between a pair of adjacent sensors being $\Delta$;
   a pseudorandom selector adapted to obtain, during a current coherent dwell, a plurality of M samples, M being less than N times D;
   a processor configured for determining angle and frequency of transmission of a transmitter located at a range R and an angle $\theta$ relative to a plane of the sensor array and transmitting a signal at a frequency f, by minimizing an l1 norm by solving an underdetermined linear system comprising a product of: (i) a phase functional representing a mapping between time-distance and angle-frequency representations of sensor samples and (ii) the plurality of M samples, the time-distance representation being based on the spacing $\Delta$, and the angle-frequency representation being based on $\theta$ and f.

25. The system of claim 24, wherein to obtain the plurality of M samples, the pseudorandom selector is adapted to:
   select at least one of the N sampling periods;
   for each selected sampling period, obtain a sample from at least one of the D sensors; and
   at least one of:
      (i) select at least one of the N sampling periods during each of which a sample is not obtained; and
      (ii) during at least one of the selected sampling periods, select at least one of the D sensors from which a sample is not obtained.

26. The system of claim 25, wherein to obtain a sample from at least one of the D sensors for each selected sampling period, the pseudorandom selector is further adapted to reject a sample from a sensor if a signal-to-noise ratio (SNR) associated with that sample is less than a specified threshold.

27. The system of claim 24 wherein the plurality of M samples comprises at least:
   a first sample associated with a transmission at a first frequency; and
   a second sample associated with a transmission at a second, different frequency.

28. The system of claim 24, wherein to solve the underdetermined linear system the processor is further programed as a second order cone programming (SOCP) solver.

* * * * *

UNITED STATES PATENT AND TRADEMARK OFFICE
CERTIFICATE OF CORRECTION

| | |
|---|---|
| PATENT NO. | : 10,145,871 B2 |
| APPLICATION NO. | : 14/699871 |
| DATED | : December 4, 2018 |
| INVENTOR(S) | : Muthu M. Baskaran et al. |

It is certified that error appears in the above-identified patent and that said Letters Patent is hereby corrected as shown below:

In the Specification

At Column 1, Line 13, insert:
-- STATEMENT OF GOVERNMENT SUPPORT
This invention was made with government support under Contract No. HR0011-12-C-0123 awarded by the Defense Advanced Research Projects Agency (DARPA). The government has certain rights in the invention. --

Signed and Sealed this
Fifth Day of July, 2022

*Katherine Kelly Vidal*

Katherine Kelly Vidal
*Director of the United States Patent and Trademark Office*